United States Patent [19]
Toyota et al.

[11] Patent Number: 5,422,822
[45] Date of Patent: Jun. 6, 1995

[54] APPARATUS FOR DETECTING REMANENT STORED ENERGY IN STORAGE BATTERY AND APPARATUS FOR WARNING OF REDUCTION IN REMANENT STORED ENERGY IN STORAGE BATTERY

[75] Inventors: Hideki Toyota; Takahiro Iwata; Isao Hyugaji, all of Wako, Japan

[73] Assignee: Honda Giken Kogyo Kabushiki Kaisha, Tokyo, Japan

[21] Appl. No.: 900,594

[22] Filed: Jun. 18, 1992

[30] Foreign Application Priority Data

Jun. 20, 1991 [JP] Japan .................................. 3-148827
Jul. 8, 1991 [JP] Japan .................................. 3-166689

[51] Int. Cl.$^6$ ............................................. G01R 19/32
[52] U.S. Cl. ..................................... 364/483; 324/432; 324/427
[58] Field of Search ............ 364/483, 481, 707, 273.4; 320/39, 40, 36, 43, 21; 324/432, 433, 426, 427, 434, 425, 428; 395/250

[56] References Cited

U.S. PATENT DOCUMENTS

| | | | |
|---|---|---|---|
| 4,390,841 | 6/1983 | Martin et al. | 324/427 |
| 4,595,880 | 6/1986 | Patil | 324/427 |
| 4,947,123 | 8/1990 | Minezawa. | |
| 5,027,294 | 6/1991 | Fakruddin et al. | 364/483 |
| 5,047,961 | 9/1991 | Simousen | 364/483 |
| 5,193,067 | 3/1993 | Sato et al. | 320/39 |

FOREIGN PATENT DOCUMENTS

| | | |
|---|---|---|
| 0090338 | 3/1983 | European Pat. Off. . |
| 0388523 | 11/1989 | European Pat. Off. . |
| 2116728 | 2/1982 | United Kingdom . |
| 9108494 | 11/1989 | WIPO . |

OTHER PUBLICATIONS

EPO Search Report dated Oct. 20, 1992.

*Primary Examiner*—Ellis B. Ramirez
*Assistant Examiner*—Thomas Peeso
*Attorney, Agent, or Firm*—Lyon & Lyon

[57] ABSTRACT

A reference amount of consumed energy of a storage battery on an electric-powered vehicle is calculated by adding values of a discharging current of the storage battery which are detected at predetermined time intervals since the storage battery was fully charged. The reference amount of consumed energy is corrected, i.e., multiplied, by consumed-energy corrective coefficients based on the battery temperature, the discharging current, the battery voltage, and the specific gravity of the storage battery, thereby determining an amount of consumed electric energy. A reference amount of remanent stored energy of the storage battery is determined by deducting the determined amount of consumed electric energy from an initial amount of stored energy of the storage battery. The reference amount of remanent stored energy is then corrected, i.e., multiplied, by remanent-energy corrective coefficients based on the ratio of amounts of charged and discharged energy, the number of times that the storage battery has been charged, and the battery temperature.

38 Claims, 9 Drawing Sheets

APPARATUS FOR DETECTING REMANENT STORED ENERGY IN STORAGE BATTERY AND APPARATUS FOR WARNING OF REDUCTION IN REMANENT STORED ENERGY IN STORAGE BATTERY

BACKGROUND OF THE INVENTION

1. Field of the Invention

The present invention relates to an apparatus for detecting the remanent stored energy in a storage battery for use on an electric-powered vehicle, and an apparatus for warning of a reduction in the remanent stored energy in such a storage battery.

2. Description of the Prior Art

Engine-powered vehicles and recently developed electric-powered vehicles generally have a storage battery such as a lead storage battery as an electric power source. Since the storage battery must store a necessary amount of electric energy at all times to enable the vehicle to run, it is important to detect the remanent stored energy in the storage battery for the driver to recognize the same.

On the engine-powered vehicles, while the electric energy stored in the storage battery is somewhat self-discharged, the storage battery is charged by an alternator while the vehicle is running, i.e., while the engine is in operation. Therefore, the remanent stored energy in the storage battery does not need to be accurately detected, but only a relatively rough estimate of the remanent stored energy will be sufficient.

While the electric-powered vehicles are running, however, the electric energy stored in the storage battery is consumed by the motor and other electric devices on the vehicle, and the storage battery is not charged except upon regenerative braking. When the electric-powered vehicles are parked, the the electric energy stored in the storage battery is self-discharged. Consequently, it is necessary to detect the remanent stored energy in the battery highly accurately so that the driver can recognize the remaining distance the vehicle can travel with the remanent stored energy or can schedule the re-charging of the battery.

There have been proposed various methods of detecting the remanent stored energy in a storage battery. According to one process, the remanent stored energy in a storage battery is detected by detecting a voltage across the battery. Another method detects the specific gravity of the electrolyte of the battery to determine the remanent stored energy in the battery. In still another process, the integrated value of a current flowing between battery terminals per unit time is measured as the amount of electric energy which is consumed from the battery, and the detected amount of consumed electric energy is deducted from the initial amount of stored electric energy, thereby detecting the remanent stored energy in the battery. It is also known to combine these methods to determine the remanent stored energy in a storage battery.

Generally, the actual remanent stored energy in a storage battery is affected by various factors including, for example, the voltage across the battery, the specific gravity of the electrolyte, the integrated value of the current flowing between the battery terminals, the temperature of the battery, the magnitude of a discharging current flowing when the battery is discharged, the number of times that the battery has been discharged, the temperature at the time the battery is charged, and the amount of electric energy that can be charged at one time.

If it is attempted to detect the remanent stored energy in a storage battery based on limited parameters, such as the voltage across the battery, among the above numerous factors, then the remanent stored energy cannot accurately be detected, and the detected energy may sometimes differ greatly from the actual remanent stored energy because of the other factors.

Particularly, the voltage across the battery and the specific gravity of the electrolyte tend to vary to a large extent depending on the running condition of the vehicle, i.e., acceleration or deceleration. If these two factors are relied upon to detect the remanent stored energy, then it is highly difficult to accurately determine the remanent stored energy.

In view of the above considerations, it would be most preferable to provide data indicating the energy storage characteristics of a vehicle-mounted battery as a function of variables composed of all possible factors and to determine the remanent stored energy based on the data. Inasmuch as the factors that affect the remanent stored energy are intricately related to each other, the data would not easily be produced, and the number of items of the data would be too enormous to be practical.

Storage batteries can restore their initial performance if charged by an external power supply at suitable times. On electric-powered vehicles, however, the electric energy stored in the battery is consumed by an electric motor which is a main power source for driving the vehicle, and any remanent stored energy in the battery is liable to be easily reduced quickly. A large and quick reduction in the remanent stored energy is responsible for shortening the service life of the battery, resulting in a reduction in the charging efficiency. The battery cannot be charged up to an initial level of energy that the battery was initially capable of storing when charged. If an electric-powered vehicle is parked for a long time with a battery having a reduced remanent stored energy, then the remanent stored energy is further reduced because the battery is self-discharged while the vehicle is being parked. Sometimes, the remanent stored energy in the battery becomes too low to get the vehicle started after parking.

The electric-powered vehicles should preferably be equipped with some means for making the driver recognize a reduction in the stored battery energy and prompting the driver to charge the battery early. Preferably, the driver should recognize a reduction in the stored battery energy when the driver gets out of the vehicle after parking the vehicle, so that the driver can take action to have the battery charged.

One example of such means for making the driver recognize a need for charging the battery on electric-powered vehicles is a remanent battery energy meter which corresponding to the fuel meter of an engine-powered vehicle. The remanent battery energy meter comprises lamps for optically indicating messages meaning "NO BATTERY CHARGING REQUIRED", "BATTERY CHARGING REQUIRED", "RUNNING TROUBLE", etc.

Since the optical indications on the remanent battery energy meter are only visually effective, the driver may not fully recognize a need for charging the battery when it really needs to be charged. This is because the driver tends to think that the electric-powered vehicle can start again if any amount of electric energy remains stored in the battery, just like the fuel in the fuel tank of an engine-powered vehicle, and also because the driver often fails to confirm the remanent battery energy meter when he gets out of the vehicle.

Therefore, there has been a demand for reliably letting the driver, when the remanent battery energy is lowered a certain extent, recognize a need for charging the battery before the driver gets out of and leaves the vehicle.

SUMMARY OF THE INVENTION

It is an object of the present invention to provide an apparatus for easily detecting the remanent stored energy in a storage battery as closely to the actual level of remanent stored energy as possible.

Another object of the present invention is to provide an apparatus for warning of a reduction in the remanent stored energy in a storage battery to make the driver of a vehicle reliably recognize a need for charging the storage battery before the driver gets off and leaves the vehicle.

Among various factors which affect the remanent stored energy in a storage battery, a discharging current which flows when the storage battery is discharged, a charging current supplied to charge the storage battery, the temperature of the storage battery, and the number of times that the storage battery has been charged can easily be detected relatively accurately. In particular, the discharging current is considered to greatly affect the actual level of remanent stored energy of the battery.

To achieve the above objects, there is provided in accordance with the present invention, an apparatus for detecting the remanent stored energy in a storage battery, comprising current detecting means for detecting discharging and charging currents of the storage battery, temperature detecting means for detecting a temperature of the storage battery, counting means for detecting the number of times that the storage battery has been charged, discharging current adding means for adding values of the discharging current of the storage battery as detected by the current detecting means at predetermined time intervals since the storage battery was fully charged and for storing the added values as a reference amount of consumed energy of the storage battery, consumed energy calculating means for multiplying the reference amount of consumed energy at a present time by a first consumed-energy corrective coefficient which is determined depending on the temperature of the storage battery as detected by the temperature detecting means at the present time, thereby determining an amount of consumed electric energy of the storage battery, subtracting means for subtracting the amount of consumed electric energy determined by the consumed energy calculating means from an initial amount of stored energy of the storage battery, thereby determining the difference as a reference remanent stored energy of the storage battery, charging current adding means for adding values of the charging current of the storage battery as detected by the current detecting means at predetermined time intervals when the storage battery is charged and for storing the added values as an amount of charged energy of the storage battery, processing means for determining, as a first remanent-energy corrective coefficient, the ratio of the reference amount of consumed energy which has been stored by the discharging current adding means immediately before the storage battery is last charged and the amount of charged energy which has been stored by the charging current adding means when the last charging of the storage battery is completed, and remanent energy calculating means for determining a remanent stored energy of the storage battery by multiplying the reference remanent stored energy stored by the subtracting means, by the first remanent-energy corrective coefficient and a second remanent-energy corrective coefficient which is predetermined depending on the total number of times that the storage battery has been charged as detected by the counting means and the temperature of the storage battery as detected by the temperature detecting means when the storage battery is last charged.

The amount of consumed electric energy is determined by correcting the reference amount of consumed energy, i.e., multiplying the reference amount of consumed energy by the first consumed-energy corrective coefficient. The determined amount of consumed electric energy is representative of a substantially actual amount of consumed electric energy of the storage battery.

Since the reference amount of consumed energy most affects the amount of consumed electric energy of the storage battery, the amount of consumed electric energy can be determined taking the temperature of the battery into account when the reference amount of consumed energy is corrected by the first consumed-energy corrective coefficient which is determined depending on the temperature of the storage battery that is a factor for affecting the remanent stored energy of the storage battery.

The remanent stored energy of the storage battery is determined when the reference remanent stored energy is corrected, i.e., multiplied, by the first and second remanent-energy corrective coefficients, and the remanent stored energy thus determined is indicative of a substantially actual amount of remanent stored energy of the storage battery.

The reference remanent stored energy substantially represents the remanent stored energy of the storage battery. The first remanent-energy corrective coefficient is equal to the ratio of the the reference amount of consumed energy before the storage battery is last charged and the amount of charged energy when the last charging of the storage battery is completed, i.e., the ratio of the amount of discharged energy and the amount of charged energy. The second remanent-energy corrective coefficient is determined depending on the total number of times that the storage battery has been charged and the temperature of the storage battery when the storage battery is last charged.

The remanent stored energy which is determined when the reference remanent stored energy is multiplied by the first and second remanent-energy corrective coefficients takes into account the amount of charged energy, the amount of discharged energy, the number of times that the storage battery has been charged, and the temperature of the storage battery when it is charged, as factors that affect the remanent stored energy of the storage battery.

To determine the amount of consumed electric energy of the storage battery, the reference amount of consumed energy may further be multiplied by a second consumed-energy corrective coefficient which varies depending on the discharging current of the storage battery, a third consumed-energy corrective coefficient which is predetermined depending on the discharging current and a period of time during which the detected discharging current is continuously maintained at a constant level up to the present time, a fourth consumed-energy corrective coefficient which is predetermined depending on the voltage across the storage battery, and a fifth consumed-energy corrective coefficient which is predetermined depending on the specific gravity of the storage battery. The remanent stored energy of the storage battery can be determined more accurately when taking these additional corrective coefficients or factors into consideration.

According to the present invention, there is also provided an apparatus for warning of a reduction in the remanent stored energy of a storage battery installed as a power source on an electric-powered vehicle, comprising remanent energy detecting means for detecting the remanent stored energy of the storage battery, switch opening/closing detecting means for detecting whether a main switch of the electric-powered vehicle is turned on or off, door opening/closing detecting means for detecting whether a door of the electric-powered vehicle is open or closed, door locking detecting means for detecting whether the door is locked or not, and warning controlling means for producing a warning sound if the remanent stored energy of the storage battery as detected by the remanent energy detecting means is smaller than a predetermined level when the main switch is turned off as detected by the switch opening/closing means, the door is open as detected by the door opening/closing means, the door is locked as detected by the door locking detecting means after the door has been opened.

When the main switch is turned off, then the door is opened and then locked, it is determined that the driver of the electric-powered vehicle got out of the vehicle and is about to leave the vehicle for a long period of time. If the remanent stored energy of the storage battery is lower than the predetermined level at this time, then the remanent stored energy may possibly be reduced too low to get the vehicle started again while the driver is away. In this case, the warning controlling means produces a warning sound, letting the driver recognize a need for charging the storage battery. The warning sound is effective to make the driver reliably recognize the need for charging the storage battery.

In the apparatus for warning of a reduction in the remanent stored energy, the remanent energy detecting means should preferably comprise the foresaid apparatus for detecting the remanent stored energy in the storage battery. The apparatus for detecting the remanent stored energy and the apparatus for warning of a reduction in the remanent stored energy, when combined with each other, are capable of detecting the actual remanent stored energy and also of letting the driver of the vehicle reliably recognize the need for charging the storage battery based on the detected actual remanent stored energy.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
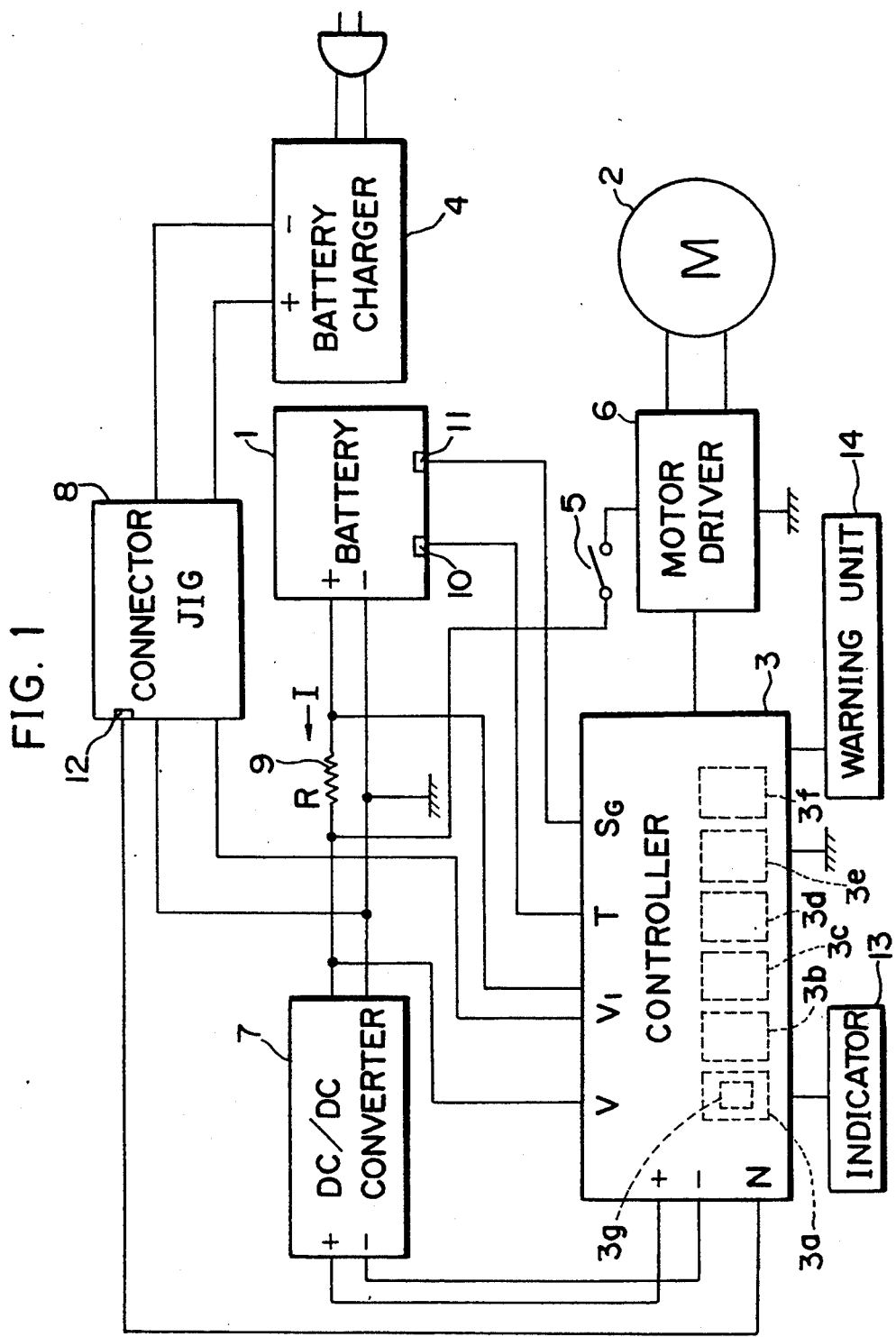
FIG. 1 is a block diagram of an electric system of an electric-powered vehicle which incorporates an apparatus for detecting the remanent stored energy in a storage battery according to the present invention.

FIG. 1 shows an electric system of an electric-powered vehicle which incorporates an apparatus for detecting the remanent stored energy in a storage battery according to the present invention.

As shown in FIG. 1, the electric system includes a storage battery 1 such as a lead storage battery, an electric motor 2 for driving the electric-powered vehicle, a controller 3 comprising a CPU, a RAM, and a ROM (not shown), and a battery charger 4 for charging the storage battery 1.

The electric energy stored in the storage battery 1 is supplied to the motor 2 through a main switch 5 and a motor driver 6 that is controlled by the controller 3, thereby energizing the motor 2 to drive the electric-powered vehicle. The controller 3 is connected to the storage battery 1 through a DC/DC converter 7, which lowers a voltage V across the storage battery 1 and supplies the lowered voltage as a power voltage to the controller 3.

The battery charger 4 may be either provided separately from the electric-powered vehicle or mounted on the electric-powered vehicle. To charge the storage battery 1, the battery charger 4 is detachably connected through a connector jig 8 to the storage battery 1 while the electric-powered vehicle is at rest. The battery charger 4 supplies electric power from a commercial power outlet at home to the storage battery 1 for thereby charging the storage battery 1.

An arrangement for detecting the remanent stored energy in the storage battery I will be described below.

The storage battery 1 is connected to its loads, i.e., the motor driver 6 and the DC/DC converter 8, through connector lines including a shunt resistor 9. A voltage $V_I$ across the shunt resistor 9, which corresponds to a discharging current or a charging current of the storage battery 1, is applied to the controller 3. The controller 3 determines the discharging current or the charging current (both hereinafter referred to as a battery current I) according to the equation $I = V_I/R$ where R is the resistance of the shunt resistor 9. Whether the battery current I is the discharging current or the charging current is determined based on the polarity of the voltage $V_I$, for example. The shunt resistor 9 and the controller 3 jointly serve as a current detecting means. The battery current I may also be determined by a non-contant current detector or other known current detector.

The voltage V across the storage battery 1 is also applied to the controller 3. Therefore, the controller 3 also serves as a voltage detecting means.

The storage battery 1 is associated with a temperature sensor 10 for detecting the temperature T of the electrolyte of the storage battery 1 and and a specific gravity sensor 11 for detecting the specific gravity $S_G$ of the electrolyte of the storage battery 1. The temperature sensor 10 serves as a temperature detecting means, and the specific gravity sensor 11 as a specific gravity detecting means. These sensors 10, 11 are mounted in a case of the storage battery 1.

The connector jig 8 is associated with a sensor 12, such as a switch sensor, for outputting a signal when the battery charger 4 is connected to the connector jig 8. The sensor 12 thus serves as a connection detecting means for detecting whether the battery charger 4 is connected to the connector jig 8 or not. The output signal from the sensor 12 is supplied to the controller 3. Based on the output signal from the sensor 12, the controller 3 counts the number of times that the battery charger 4 has been connected to the connector jig 8, as the number of times or count N that the storage battery 1 has been charged. The sensor 12 and the controller 3 jointly serve as a counting means.

Therefore, the controller 3 detects the battery current I, the battery voltage V, the battery temperature T, the specific gravity $S_G$, and the count N, as data for detecting the remanent stored energy of the storage battery 1. The battery current I, the battery voltage V, the battery temperature T, and the specific gravity $S_G$ are detected at every predetermined sampling time interval, e.g., of 10 ms. The controller 3 has various functions or means for processing the detected data, i.e., a discharging current adding means 3a, a charging current adding means 3b, a consumed energy calculating means 3c, a subtracting means 3d, a processing means 3e, and a remanent energy calculating means 3f. The remanent stored energy in the storage battery 1 is determined by these means as described later on.

To the controller 3, there are connected an indicator 13 for indicating the remanent stored energy in the storage battery 1 which has been determined by the controller 3, and a warning unit 14 for warning the driver of the electric-powered vehicle when the determined remanent stored energy is low.

Figure 2:
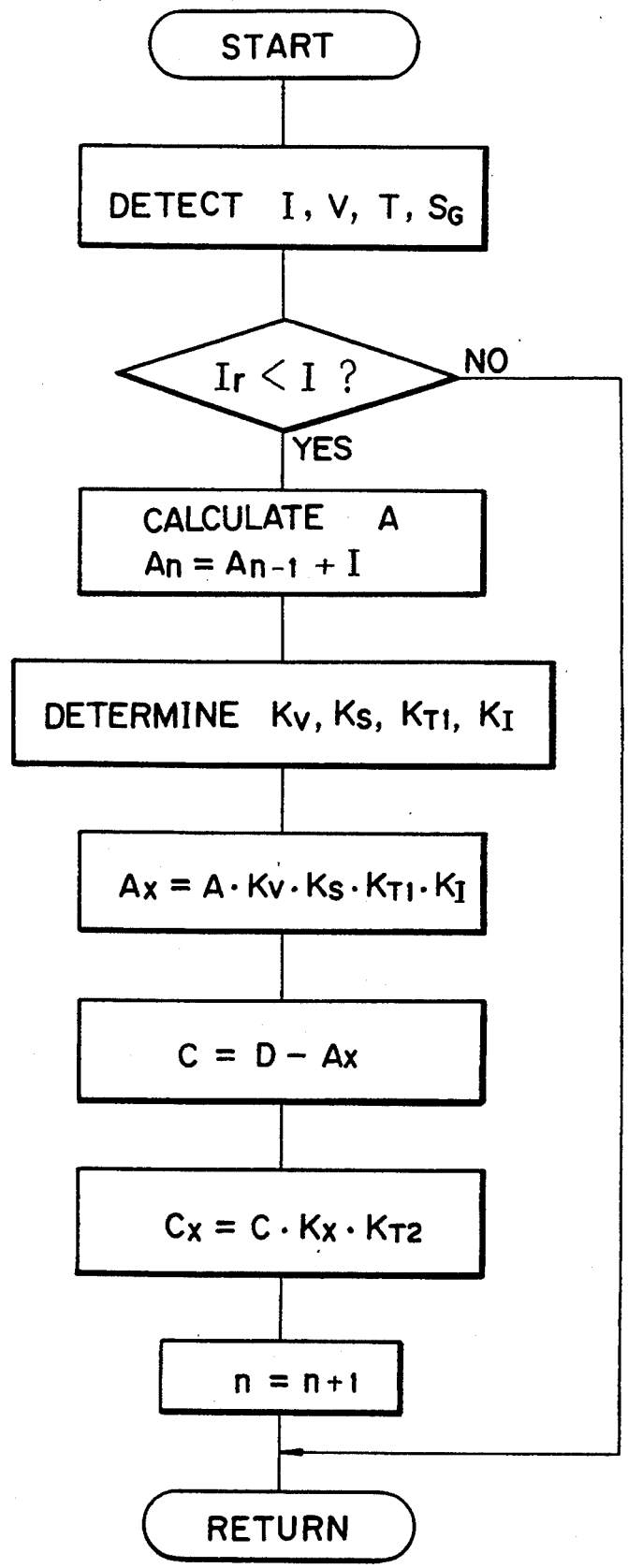
FIGS. 2 and 3 are flowcharts of an operation sequence of the apparatus for detecting the remanent stored energy in a storage battery.

The controller 3 executes a subroutine shown in FIG. 2 at every predetermined sampling time interval for determining the remanent stored energy in the storage battery 1. The operation sequence shown in FIG. 2 is carried out other than when the battery 1 is charged, i.e., it is carried out as when the electric-powered vehicle is running. An operation sequence to be executed when the battery 1 is charged will be described later on.

Now, the operation sequence shown in FIG. 2 will be described. First, the controller 3 detects, as data for determining the remanent stored energy in the storage battery 1, the discharging current I, the battery voltage V, the battery temperature T, and the specific gravity $S_G$, and then determines whether the detected discharging current I is lower than a predetermined value $I_r$ (such as 2A, for example) or not. If the detected discharging current I is equal to or lower than the predetermined value $I_r$ ($I \geq I_r$), then the subroutine is ended without determining the remanent stored energy in the storage battery 1. If the detected discharging current I is greater than the predetermined value $I_r$ ($I > I_r$), then the subroutine is executed to determine the remanent stored energy in the storage battery 1. Relatively small levels of the detected discharging current I are excluded from consideration in the subroutine shown in FIG. 2 because, in this embodiment, only relatively large currents flowing from the storage battery 1 to the motor 1 are taken into account for the calculation of the remanent battery energy, and relatively small currents flowing from the battery 1 to the controller 3 and various accessories are left out of consideration as not virtually affecting the remanent stored energy in the storage battery 1.

If $I > I_r$, then the discharging current adding means 3a of the controller 3 calculates the sum of accumulated values of the discharging current I detected thus far up to the present subroutine, as a reference amount A of consumed energy of the storage battery 1. The controller 3 stores the calculated reference amount A of consumed energy in the RAM. The sum of accumulated values of the discharging current I is calculated by adding, to the sum of current values accumulated thus far, the value of the discharging current I which is detected each time the subroutine is executed from the time the battery 1 is fully charged ($A_n = A_{n-1} + I$). The storage battery 1 is fully charged when the voltage V across the storage battery as it is charged by the battery charger 4 reaches a predetermined full-charge voltage as detected by the controller 3. When the battery voltage V reaches the predetermined full-charge voltage, the battery charger 4 automatically stops the charging of the storage battery 1. Each time the storage battery 1 is fully charged by the battery charger 4, the discharging current adding means 3a clears the sum of accumulated values of the discharging current I, i.e., the reference amount A of consumed energy, to "0".

After the reference amount A of consumed energy of the storage battery 1 has been calculated, the consumed energy calculating means 3c of the controller 3 corrects the reference amount A of consumed energy based on the detected data, as described above, thereby calculating an amount $A_x$ of consumed electric energy of the storage battery 1, according to the following equation:

$$A_X = A \cdot K_V \cdot K_S \cdot K_{T1} \cdot K_I \qquad (1)$$

where $K_V$, $K_S$, $K_{T1}$, $K_I$ are consumed-energy corrective coefficients for correcting the reference amount A of consumed energy. These consumed-energy corrective coefficients $K_V$, $K_S$, $K_{T1}$, $K_I$ are determined based on the detected data, as described in detail below.

Figure 4:
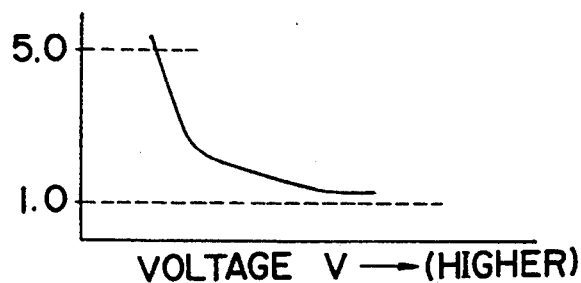
FIGS. 4 through 12 are graphs illustrative of corrective coefficients.

The consumed-energy corrective coefficient $K_V$ is used to correct the reference amount A of consumed energy according to the voltage V across the storage battery 1. Consumed-energy corrective coefficients $K_V$ corresponding to respective battery voltages V are stored as a data table as shown in FIG. 4 in the ROM of the controller 3. Based on the presently detected battery voltage V, the consumed energy calculating means 3c determines a corresponding con-sumed-energy corrective coefficient $K_V$ from the data table, and uses the determined consumed-energy corrective coefficient $K_V$ in the calculation according to the equation (1). As shown in FIG. 4, as the voltage V across the storage battery 1 is lower, the consumed-energy corrective coefficient $K_V$ is of a greater value. Therefore, the smaller the detected battery voltage V, the greater the amount $A_X$ of electric consumed energy.

Figure 6:
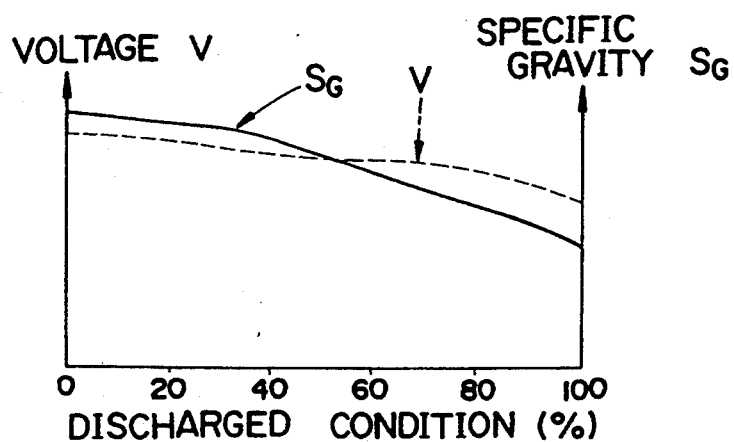

The characteristic of the consumed-energy corrective coefficient $K_V$ shown in FIG. 4 is determined based on the battery characteristic as shown in FIG. 6, for example. A broken-line curve in FIG. 6 indicates, by way of example, the relationship between the discharged condition of the storage battery 1 and the voltage V across the storage battery 1. The discharged condition indicated on the horizontal axis of the graph of FIG. 6 is a relative representation of the amount of discharged energy of the storage battery 1, i.e., the degree of progress of the battery discharge. As can be seen from FIG. 6, as the battery discharge progresses, the voltage V across the storage battery 1 decreases. Therefore, the lower the battery voltage V, the smaller the remanent battery energy. Stated otherwise, the lower the battery voltage V, the greater the amount of consumed energy of the storage battery 1. For this reason, the characteristic of the consumed-energy corrective coefficient $K_V$ with respect to the battery voltage V is determined as shown in FIG. 4.

Figure 5:
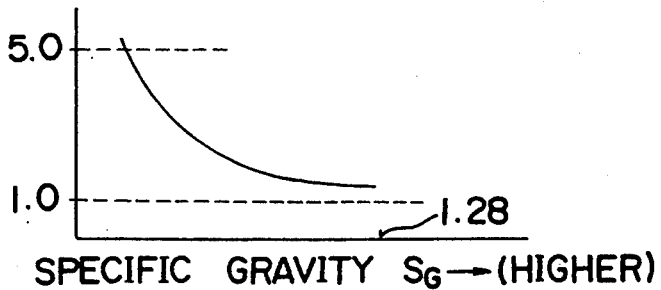

The consumed-energy corrective coefficient $K_S$ is used to correct the reference amount A of consumed energy according to the specific gravity $S_G$ of the electrolyte of the storage battery 1. Consumed-energy corrective coefficients $K_S$ corresponding to respective specific gravities $S_G$ are stored as a data table as shown in FIG. 5 in the ROM of the controller 3. Based on the presently detected specific gravity $S_G$, the consumed energy calculating means 3c determines a corresponding consumed-energy corrective coefficient $K_S$ from the data table, and uses the determined consumed-energy corrective coefficient $K_S$ in the calculation according to the equation (1). As shown in FIG. 5, as the specific gravity $S_G$ across the storage battery 1 is lower, the consumed-energy corrective coefficient $K_S$ is of a greater value. Therefore, the smaller the detected specific gravity $S_G$, the greater the amount $A_X$ of electric consumed energy.

The characteristic of the consumed-energy corrective coefficient $K_S$ shown in FIG. 5 is determined based on the battery characteristic as shown in FIG. 6. A solid-line curve in FIG. 6 indicates, by way of example, the relationship between the discharged condition of the storage battery 1 and the specific gravity $S_G$ of the storage battery 1. As can be seen from FIG. 6, as the battery discharge progresses, the specific gravity $S_G$ of the storage battery 1 decreases. Therefore, the lower the specific gravity $S_G$, the smaller the remanent battery energy. Stated otherwise, the lower the specific gravity $S_G$, the greater the amount of consumed energy of the storage battery 1. For this reason, the characteristic of the consumed-energy corrective coefficient $K_S$ with respect to the specific gravity $S_G$ is determined as shown in FIG. 5.

The consumed-energy corrective coefficient $K_{T1}$ is used to correct the reference amount A of consumed energy according to the discharging current I and the temperature T of the storage battery 1. Consumed-energy corrective coefficients $K_{T1}$ corresponding to respective discharging currents I and temperatures T are stored as a map as shown in Table 1, below, in the ROM of the controller 3. Based on the presently detected discharging current I and temperature T, the consumed energy calculating means 3c determines a corresponding consumed-energy corrective coefficient $K_{T1}$ from the map, and uses the determined consumed-energy corrective coefficient $K_{T1}$ in the calculation according to the equation (1).

TABLE 1

|  |  | I |  |
|---|---|---|---|
| $K_{T1}$ |  | 0.1 C . . . . . 3 C |  |
| T °C. | −20 | 2.0 . . . . . 4.0 |  |

TABLE 1-continued

|  |  | I |  |
|---|---|---|---|
| $K_{T1}$ |  | 0.1 C . . . . . 3 C |  |
|  | 30 | 1.0 . . 1.5 . . 2.0 |  |
|  | 50 | 1.0 . . . . . 1.6 |  |

As shown in Table 1 above, the consumed-energy corrective coefficient $K_{T1}$ is greater as the discharging current I is higher, and is smaller as the temperature T is higher. Therefore, the greater the detected discharging current I, the greater the amount $A_X$ of electric consumed energy, and the higher the detected temperature T, the smaller the amount $A_X$ of electric consumed energy.

Figure 7:
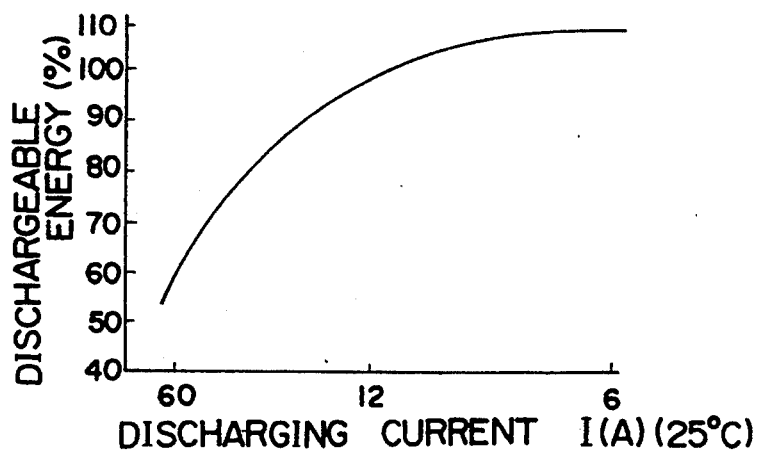
Figure 8:
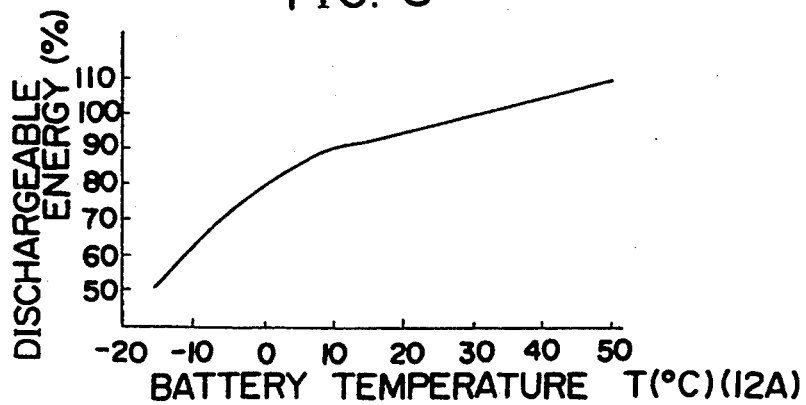

The characteristic of the consumed-energy corrective coefficient $K_{T1}$ is determined based on the battery characteristics as shown in FIGS. 7 and 8, for example. The curve in FIG. 7 indicates, by way of example, the relationship between the dischargeable energy (the amount of energy that can be discharged by the storage battery 1) and the discharging current I of the storage battery 1. The curve in FIG. 8 indicates, by way of example, the relationship between the dischargeable energy and the temperature T of the storage battery 1. The dischargeable energy indicated on the vertical axes of FIGS. 7 and 8 is a relative representation of the amount of energy that can be discharged by the storage battery 1. As can be seen from FIGS. 7 and 8, as the discharging current I is higher, the dischargeable energy decreases, and as the battery temperature T goes higher, the dischargeable energy increases. Stated otherwise, the higher the discharging current I, the greater the amount of consumed energy of the storage battery 1, and the higher the battery temperature T, the smaller the amount of consumed energy of the storage battery 1. For this reason, the characteristic of the consumed-energy corrective coefficient $K_{T1}$ with respect to the discharging current I and the battery temperature T is determined as shown in Table 1.

The consumed-energy corrective coefficient $K_I$ is used to correct the reference amount A of consumed energy according to the discharging current I and the time (discharging time) during which the discharging current I is continuously maintained at a constant level up to present, i.e., the time during which the storage battery 1 is discharged with a constant discharging current I. Consumed-energy corrective coefficients $K_I$ corresponding to respective discharging currents I and discharging times are stored as a map as shown in Table 2, below, in the ROM of the controller 3. Based on the presently detected discharging current I and discharging time, the consumed energy calculating means 3c determines a corresponding consumed-energy corrective coefficient $K_I$ from the map, and uses the determined consumed-energy corrective coefficient $K_I$ in the calculation according to the equation (1).

TABLE 2

|  |  | I |  |  |  |  |  |
|---|---|---|---|---|---|---|---|
| $K_I$ |  | 0.1 C | . | . | . | . | 3 C |
| Discharging Time (sec) | <1 | 1.0 | 1.0 | 1.0 | . | . | 1.0 |
|  | 1 | 1.0 | . | . | . | . | 1.5 |
|  | . | . | . | . | . | . | . |

TABLE 2-continued

| $K_I$ | | | I | | | |
|---|---|---|---|---|---|---|
| | 0.1 C | . | . | . | . | 3 C |
| | 60 | 1.0 | . | . | . | 3.0 |

As shown in Table 2 above, the corrective consumed-energy coefficient $K_I$ is greater as the discharging current I is higher, and is greater as the discharging time is longer. Therefore, the greater the detected discharging current I and the longer the discharging time, the greater the amount $A_X$ of electric consumed energy.

The discharging time is determined as follows: The discharging current adding means 3a of the controller 3 calculates the sum of accumulated values of the discharging current I detected in respective sampling time intervals, as described above. Furthermore, the discharging current adding means 3a also includes a memory means 3g (see FIG. 1) such as a RAM for storing detected values of the discharging current I in a time series at certain time intervals each of 1 second, for example. The memory means 3g stores a predetermined number (e.g., 60) of detected values of the discharging current I up to the present time. The stored values of the discharging current I are successively updated each time a new detected value of the discharging current I is entered into the memory means 3g. Therefore, a plurality of values of the discharging current I which are detected in the past up to the present are stored in a time series at certain time intervals in the memory means 3g.

The consumed energy calculating means 3c retrieves the stored values of the discharging current I, successively retrospectively from the present time, from the memory means 3g, and determines a period of time during which the presently detected value of the discharging current I has been kept constant up to now. For example, if the presently detected value of the discharging current I is the same as the preceding value and also the value which precedes the preceding value, i.e., if three consecutive values including the presently detected value are identical to each other, then the present discharging current has continued for a period of time which is twice the time interval between adjacent detected values of the discharging current I that are stored in the memory means 3g.

As shown in Table 2, if the discharging time or the time during which the discharging current I is kept constant is less than one second, then the consumed-energy corrective coefficient $K_I$ used is of a value of "1". In this case, the consumed-energy corrective coefficient $K_I$ is ineffective to correct the reference amount A of consumed energy.

Figure 9:
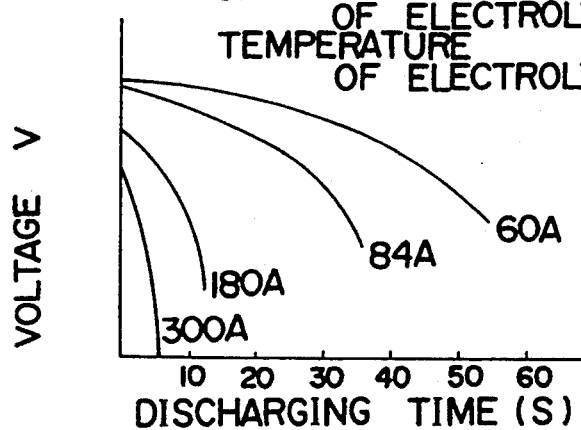

The characteristic of the consumed-energy corrective coefficient $K_I$ is determined based on the battery characteristics as shown in FIG. 9, for example. A plurality of curves in FIG. 9 indicate, by way of example, the relationship between the discharging time and the voltage V across the storage battery 1 when the storage battery 1 is discharged with different constant discharge currents I. As can be seen from FIG. 9, when the discharging current I is constant, the battery voltage V decreases with time at a rate that is greater as the discharging current I is of a higher value. Therefore, the longer the time during which a larger discharging current I flows, the remanent battery energy decreases. Stated otherwise, the higher the discharging current I, and the longer the time during which the discharging current I continues, the greater the amount of consumed energy of the storage battery 1. For this reason, the characteristic of the consumed-energy corrective coefficient $K_I$ with respect to the discharging current I and the discharging time is determined as shown in Table 2.

The amount $A_X$ of consumed electric energy determined according to the equation (1) is produced when the sum of accumulated values of the discharging current I of the storage battery 1, i.e., the reference amount A of consumed energy, is corrected by the consumed-energy corrective coefficients $K_V$, $K_S$, $K_{T1}$, $K_I$ that are determined based on the battery voltage V, the specific gravity $S_G$, the battery temperature T, and the discharging current I. The amount $A_X$ of consumed electric energy thus determined is representative of a substantially actual amount of consumed energy discharged from the storage battery 1. The reference amount A of consumed energy which is used as a reference for determining the amount $A_X$ of consumed electric energy greatly contributes to the actual amount of consumed energy. The amount $A_X$ of consumed electric energy which is produced by multiplying the reference amount A of consumed energy by the consumed-energy corrective coefficients $K_V$, $K_S$, $K_{T1}$, $K_I$ is therefore determined taking into account various factors that affect the remanent battery energy which include the battery voltage V, the specific gravity $S_G$, the battery temperature T, and the discharging current I. The amount $A_X$ of consumed electric energy can easily be determined according to the equation (1) described above.

Referring back to FIG. 2, after the amount $A_X$ of consumed electric energy has been determined, the subtracting means 3d of the controller 3 determines a reference remanent stored energy C of the storage battery 1 according the following equation (2):

$$C = D - A_X \qquad (2)$$

where D is the initial amount of electric energy stored in the storage battery 1. For example, the initial amount D of stored energy is the same as the rated storage capacity of the storage battery 1 which the manufacturer of the storage battery 1 indicates as an amount of energy that the storage battery 1 can store in a brand-new condition when fully charged. The reference remanent stored energy C which is calculated by subtracting the amount $A_X$ of consumed electric energy from the initial amount D of electric energy is substantially indicative of the remanent stored energy of the storage battery 1.

Then, the processing means 3e and the remanent energy calculating means 3f of the controller 3 correct the reference remanent stored energy C according to the following equation (3), thus determining a remanent stored energy Cx of the storage battery 1:

$$C_X = C \cdot K_X \cdot K_{T2} \qquad (3)$$

where $K_X$ and $K_{T2}$ are remanent-energy corrective coefficients.

The remanent-energy corrective coefficients $K_X$, $K_{T2}$ are determined as follows:

The remanent-energy corrective coefficient $K_X$ is represented by the ratio of a previous reference amount $A_0$ of consumed energy and an amount B of charged energy, and defined by $K_X = B/A_0$. The previous reference amount $A_0$ of consumed energy is the same as the reference amount A of consumed energy that is determined immediately before the storage battery 1 is charged most recently, i.e., immediately before the sum of accumulated values of the discharging current I stored in the discharging current adding means 3a is cleared to "0". The previous reference amount $A_0$ of consumed energy is stored in the RAM of the controller 3, for example, each time the storage battery 1 is charged. The amount B of charged energy is equal to the sum of values of the charging current I that are added at predetermined time intervals when the storage battery 1 is charged most recently. The addition of values of the charging current I and the calculation of the remanent-energy corrective coefficient $K_X$ are effected by the controller 3 when it executes a subroutine shown in FIG. 3 at the time of charging the storage battery 1.

Figure 3:
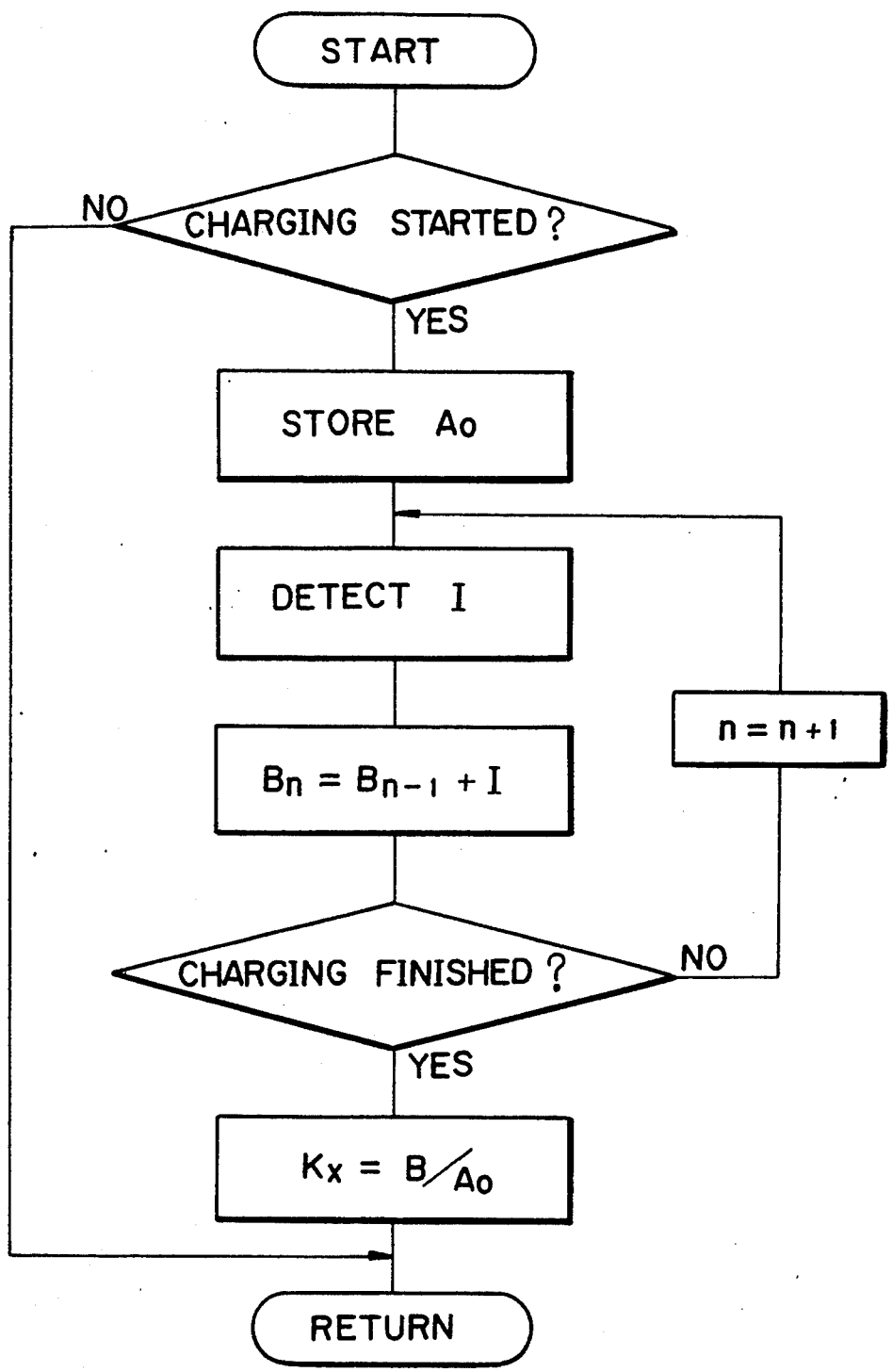

As shown in FIG. 3, when the storage battery 1 starts being charged, the controller 3 stores the reference amount A of consumed energy immediately prior to the charging of the storage battery 1 as a previous reference amount $A_0$ of consumed energy. Then, the controller 3 detects the charging current I at predetermined sampling time intervals each of 10 ms, for example. The charging current adding means 3b adds the detected values of the charging current I ($B_n = B_{n-1} + I$), and the controller 3 stores the sum as an amount B of charged energy. When the charging of the storage battery 1 is finished, the processing means 3e divides the final amount B of charged energy by the previous reference amount $A_0$ of consumed energy, and the controller 3 stores the quotient as the corrective coefficient $K_X$. In the subroutine shown in FIG. 3, the values of the charging current I are added during a period of time between the start of charging when the controller 3 detects the connection of the battery charger 4 to the connector jig 8 through the sensor 12 and the end of charging when the voltage V across the storage battery 1 reaches a predetermined full-charge voltage.

If the previous reference amount $A_0$ of consumed energy is equal to the amount B of charged energy, then the remanent-energy corrective coefficient $K_X$ has a value of 1. If $B < A_0$, then the remanent-energy corrective coefficient $K_X$ is of a value smaller than 1, and if $B > A_0$, then the remanent-energy corrective coefficient $K_X$ is of a value greater than 1. Therefore, as can be seen from the equation (3), if $B < A_0$, then the remanent stored energy $C_X$ is relatively small, and if $B > A_0$, then the remanent stored energy $C_X$ is relatively large. The reference remanent stored energy C is corrected using the remanent-energy corrective coefficient $K_X$ because the energy stored in the battery 1 when fully charged is considered to be smaller than the initial amount D of stored electric energy (see the equation (2)) as a basis for the reference remanent stored energy C if the amount B of charged energy is smaller than the previous reference amount $A_0$ of consumed energy, and the energy stored in the battery 1 when fully charged is considered to be greater than the initial amount D of stored electric energy if the amount B of charged energy is greater than the previous reference amount $A_0$ of consumed energy.

The remanent-energy corrective coefficient $K_{T2}$ in the equation (3) is used to correct the reference remanent stored energy C according to the number N of times that the storage battery 1 has been charged and the battery temperature T at the time the storage battery 1 is last charged. Remanent-energy corrective coefficients $K_{T2}$ corresponding to respective numbers T of times that the storage battery 1 is charged and temperatures T are stored as a map as shown in Table 3, below, in the ROM of the controller 3. The battery temperatures T in Table 3 are detected when the storage battery 1 starts being charged, and are stored in the ROM of the controller 3 when the storage battery 1 is charged.

TABLE 3

| $K_{T2}$ | N |  |  |  |  |  |
|---|---|---|---|---|---|---|
|  | 1 | . | . | . | . | 1000 |
| T °C. −20 | 0.90 | . | . | 0.65 | . . | 0.08 |
| . 35 | 1.00 | . | . | 0.85 | . . | 0.70 |
| . 50 | 0.98 | . | . | 0.70 | . . | 0.10 |

As shown in Table 3, the remanent-energy corrective coefficient $K_{T2}$ is basically selected such that it is smaller as the number N of times that the storage battery 1 is charged is greater, and it is greater as the battery temperature T is higher if the battery temperature T is lower than a predetermined temperature, e g, 35° C. when the storage battery 1 is charged, and it is smaller as the battery temperature T is higher if the battery temperature T is higher than the predetermined temperature, when the storage battery 1 is charged. Therefore, the remanent stored energy $C_X$ becomes smaller as the number N of times that the storage battery 1 is charged is greater, and also becomes larger as the battery temperature T increases up to the predetermined temperature and becomes smaller as the battery temperature T increases beyond the predetermined temperature, when the storage battery 1 is charged.

Figure 10:
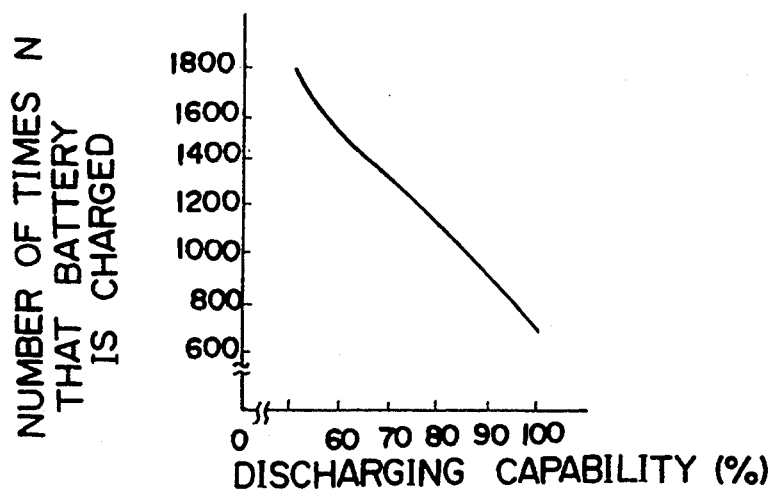
Figure 11:
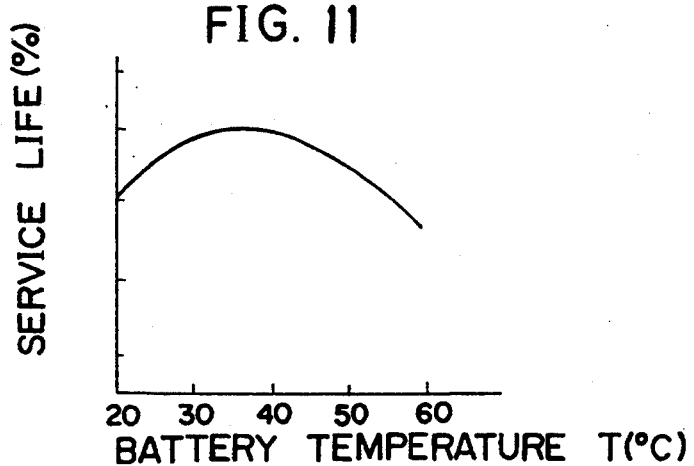

The characteristic of the remanent-energy corrective coefficient $K_{T2}$ is determined based on the battery characteristics as shown in FIGS. 10 and 11, for example. The curve in FIG. 10 indicates, by way of example, the relationship between the discharging capability of the storage battery 1 and the number N of times that the storage battery 1 has been charged. The curve in FIG. 11 indicates, by way of example, the relationship between the service life of the storage battery 1 and the temperature T of the storage battery 1. The discharging capability indicated on the horizontal axis of the graph of FIG. 10 is a relative representation of the actual stored energy of the storage battery 1 which substantially depends on the number N of times that the storage battery 1 has been charged. The service life indicated on the vertical axis of the graph of FIG. 11 is a relative representation of the number of times that the storage battery 1 can be charged so as to be able to achieve the initial performance of the storage battery 1 if it is repeatedly charged and discharged at a certain temperature. FIGS. 10 and 11 indicate that the discharging capability of the storage battery 1 becomes lower as the number N of times that it has been charged is higher, and that the service life of the storage battery 1 increases as the battery temperature T goes higher up to a certain temperature of about 35° C., and decreases as the battery temperature T further goes higher beyond that temperature. Stated otherwise, the greater the number N of times that the storage battery 1 has been charged, the lower the remanent battery energy. In a relatively low range of battery temperatures T when the storage battery 1 is charged, the remanent battery energy increases as the battery temperature T rises. In a relatively high range of battery temperatures T when the storage battery 1 is charged, the remanent battery energy decreases as the battery temperature T rises. For this reason, the characteristic of the remanent-energy corrective coefficient $K_{T2}$ with respect to the number N of times that the storage battery 1 has been charged and the battery temperature T upon charging of the storage battery 1 is determined as shown in Table 3.

As described in detail above, the remanent stored energy $C_X$ according to the equation (3) is determined when the reference remanent stored energy C, produced by deducting the amount A of consumed electric energy according to the equation (1) from the initial amount D of electric energy stored in the storage battery 1, is corrected by the remanent-energy corrective coefficients $K_X$, $K_{T2}$ that are defined as described above according to the amount B of charged energy, the previous reference amount $A_0$ of consumed energy, the number N of times that the storage battery 1 has been charged, and the battery temperature T when the storage battery 1 is charged. The remanent stored energy $C_X$ thus calculated represents a substantially actual amount of remanent stored energy of the storage battery 1. The reference remanent stored energy C, used as a reference for determining the remanent stored energy $C_X$, is an approximate indication of actual remanent stored energy of the storage battery 1, and the remanent stored energy $C_X$ which is produced by multiplying the reference remanent stored energy C by the remanent-energy corrective coefficients $K_X$, $K_{T2}$ is determined taking into consideration various factors that affect the remanent stored energy of the storage battery 1, including the amount B of charged energy, the previous reference amount $A_0$ of consumed energy, the number N of times that the storage battery 1 has been charged, and the battery temperature T when the storage battery 1 is charged. The remanent stored energy $C_X$ can be determined by simple arithmetic operations according to the equations (2) and (3), as described above.

The controller 3 indicates the calculated remanent stored energy $C_X$ on the indicator 13 (see FIG. 1), letting the driver of the electric-powered vehicle know the remanent stored energy $C_X$ of the storage battery 1. Furthermore, in the event that the remanent stored energy $C_X$ is lower than a predetermined level, the controller 3 energizes the warning unit 14 to issue a warning so that the driver can recognize a need for charging the storage battery 1.

As described above, the reference amount A of consumed energy of the battery 1, i.e., the sum of accumulated values of the discharging current I which contributes most to the actual amount of consumed energy or remanent stored energy of the storage battery 1, is corrected by the various corrective coefficients $K_V$, $K_S$, $K_{T1}$, $K_I$, $K_X$, $K_{T2}$ relative to those factors which affect the remanent stored energy, thereby determining the remanent stored energy $C_X$ of the storage battery 1. The remanent stored energy $C_X$ thus determined is therefore substantially representative of the actual amount of remanent stored energy of the storage battery 1. The remanent stored energy $C_X$ can easily be calculated by simple arithmetic operations.

Figure 12:
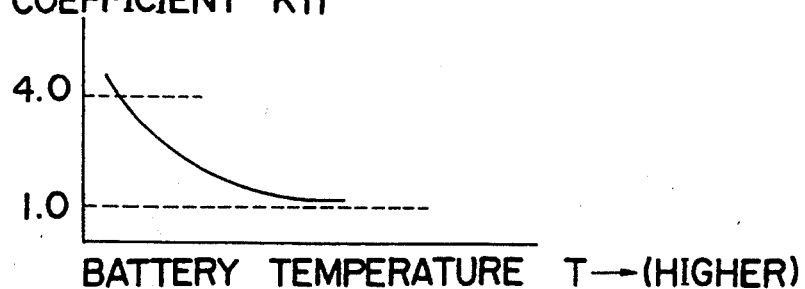

In the illustrated embodiment, the values of the consumed-energy corrective efficient $K_{T1}$ used in the equation (1) are set up as map data depending on the discharging current I and the battery temperature T as shown in Table 1. However, since the consumed-energy corrective efficient $K_{T1}$ is essentially related to the battery temperature T, their values may be stored in the ROM of the controller 3 as a data table which only depends on the battery temperature T as shown in FIG. 12. Such a data table should preferably be established such that the consumed-energy corrective efficient $K_{T1}$ becomes larger as the battery temperature T goes lower.

Inasmuch as the amount of energy stored when the storage battery 1 is fully charged gradually decreases with time, the initial amount D of stored energy used in the equation (2) may be set up such that it is reduced stepwise depending on the period of time in which the storage battery 1 is used, e.g., the period of time that elapses from the time when the storage battery 1 was installed on the electric-powered vehicle. The initial amount D of stored energy thus established allows the remanent stored energy $C_X$ to be determined with a higher degree of accuracy.

While the amount $A_X$ of stored electric energy of the storage battery 1 is determined by correcting the reference amount A of consumed energy with the consumed-energy corrective coefficients $K_V$, $K_S$ relative to the battery voltage V and the specific gravity $S_G$ as well as the consumed-energy corrective coefficients $K_{T1}$, $K_I$, it is possible to leave out the consumed-energy corrective coefficients $K_V$, $K_S$ in the calculation of the amount $A_X$ of stored electric energy.

An apparatus for warning of a reduction in the remanent stored energy of a storage battery according to the present invention will be described below with reference to FIGS. 13 through 15.

The apparatus for warning of a reduction in the remanent stored energy of a storage battery is typically installed on an electric-powered vehicle. As shown in FIG. 13, the apparatus comprises a remanent stored energy detector 22 connected to a main battery 21, which may be a lead storage battery, for detecting the remanent stored energy of the main battery 21, a motor driver 24 for controlling the supply of electric energy from the main battery 21 to an electric motor 23 to control the motor 23, a switch opening/closing detector 26 for detecting the opening and closing of a main switch 25 which is connected to the motor driver 24, a door locking detector 28 connected to a door 27 of the electric-powered vehicle for detecting whether the door 27 is locked or not, a door opening/closing detector 29 connected to the door 27 for detecting whether the door 27 is open or closed, a warning controller 30 for producing a control signal to generate a warning sound in response to signals from the detectors 22, 26, 28, 29, a sound output unit 31 for producing a warning sound in response to the control signal from the warning controller 30, an optical indicator 32a responsive to a signal from the warning controller 30 for optically indicating the remaining stored energy of the main battery 21, an optical indicator 32b for optically indicating that the main battery 21 is being charged, and a timer 33 connected to the warning controller 30 for limiting the period of time in which the warning sound is produced by the warning output unit 31. The remanent stored energy detector 22 is of the arrangement that is shown in FIG. 1 and operates in the manner shown in FIGS. 2 through 12 for detecting the remanent stored energy of the main battery 21.

Operation of the apparatus illustrated in FIG. 13 will be described below with reference to FIGS. 14 and 15.

Figure 13:
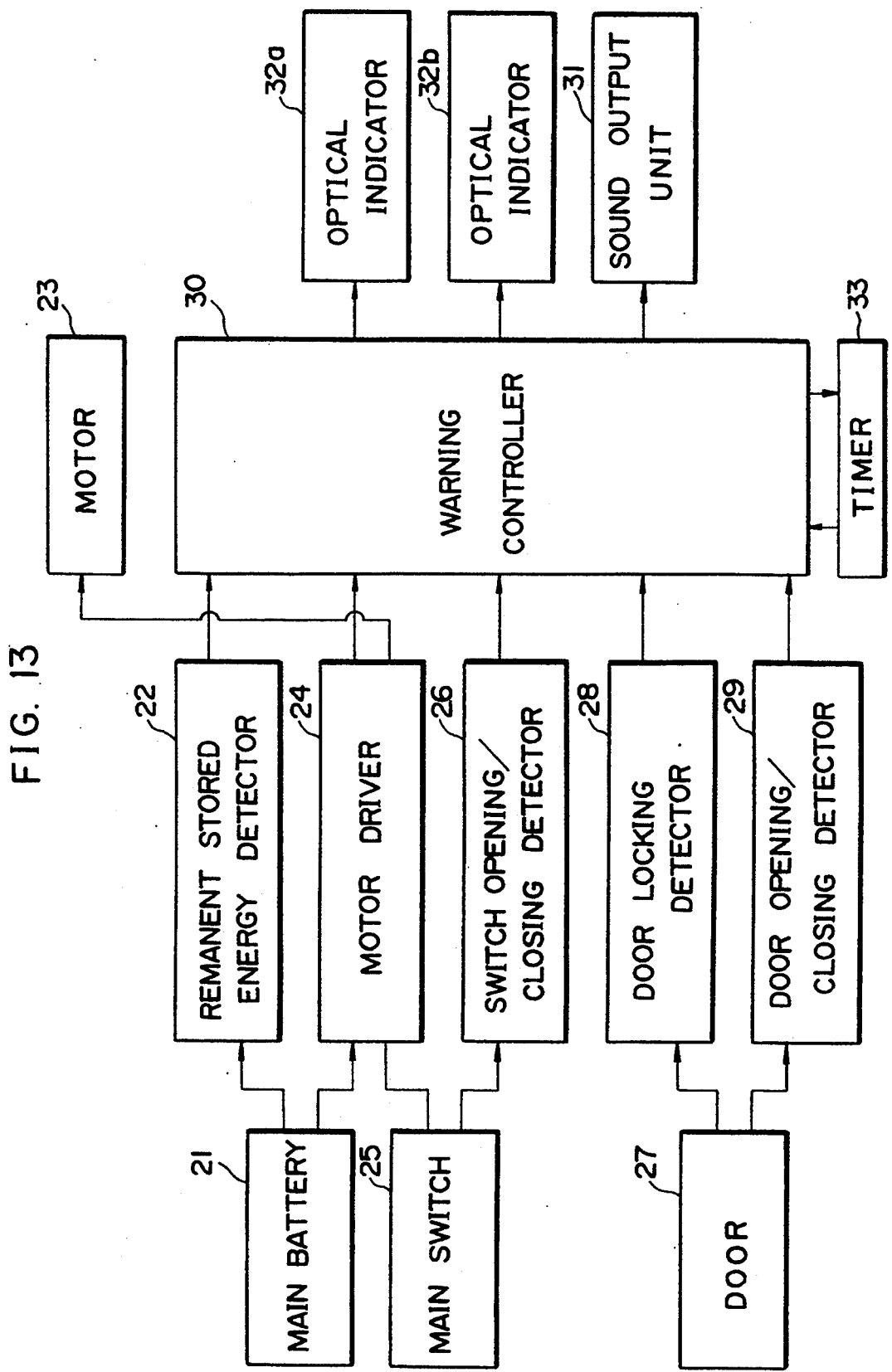
FIG. 13 is a block diagram of an apparatus for warning of a reduction in the remanent stored energy in a storage battery according to the present invention.
Figure 14:
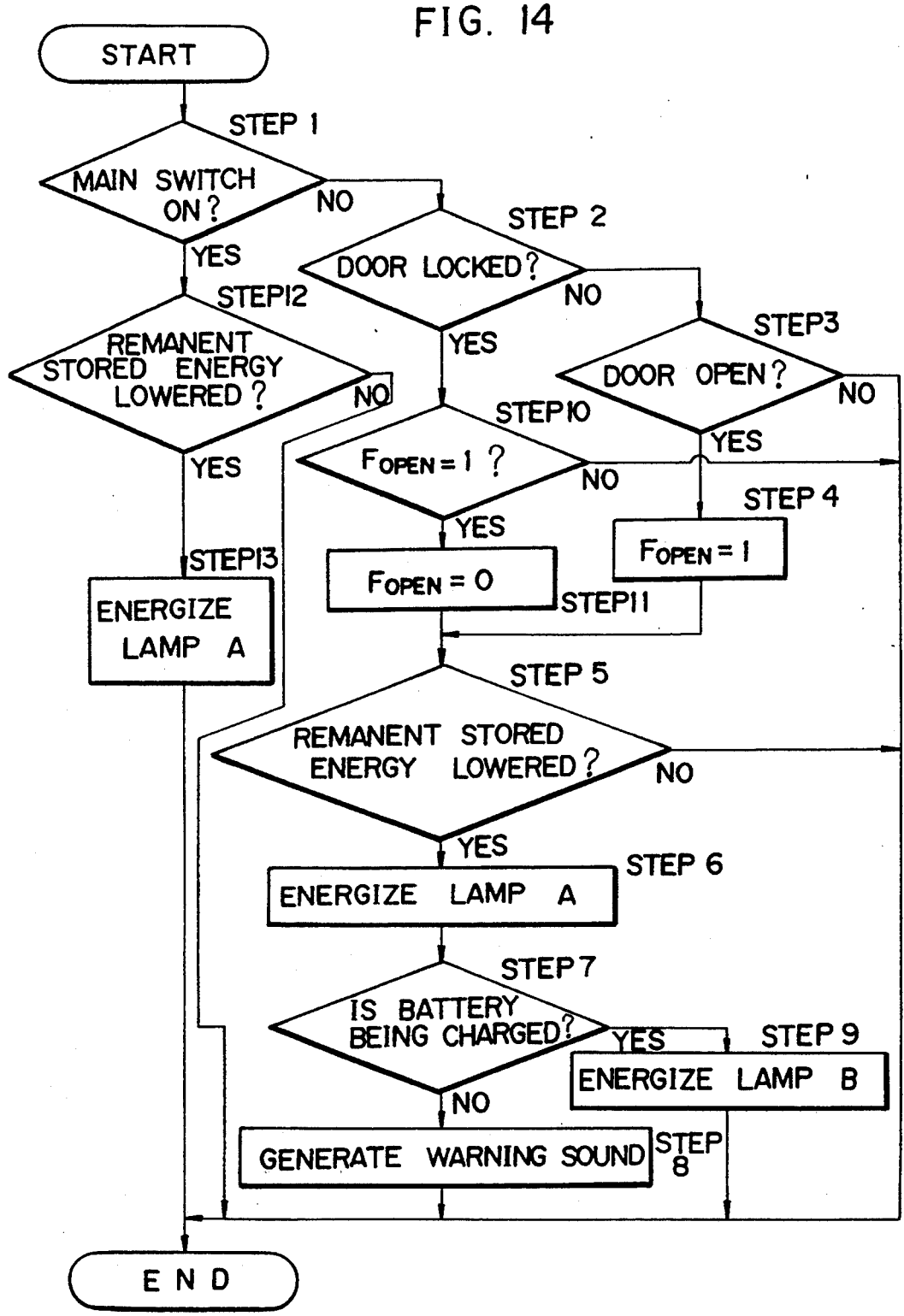
FIG. 14 of a main routine of an operation sequence of the apparatus shown in FIG. 13.

FIG. 14 shows a main routine of an operation sequence of the apparatus shown in FIG. 13.

When the apparatus issues a control signal to produce a warning sound, it generates a warning sound for a predetermined period of time irrespective of whether the electric-powered vehicle is running or at rest.

Upon start of the operation of the apparatus, the switch opening/closing detector 26 determines whether the main switch 26 is turned on or not, i.e., closed or open in a step 1. If the main switch 26 is turned off, then it indicates that the electric-powered vehicle is at rest. The door locking detector 28 determines whether the door 27 is locked or not in a step 2 for ascertaining whether the driver got out and left the vehicle.

If the door 27 is not locked, then the door opening/closing detector 29 determines whether the door 27 is open or closed in a step 3. If the door 27 is open, then the open condition of the door 27 is stored in a memory of the warning controller 30 in a step 4. More specifically, in the step 4, a flag $F_{OPEN}$ indicative of the open condition of the door 27 is set to "1". The flag $F_{OPEN}$ is initially set to "0", and set to "1" when the door 27 is open.

When the main switch 25 is turned off and then the door 27 is opened, it is determined that the driver is going to get out of the vehicle. At this time, the remanent stored energy detector 22 detects the remanent stored energy of the main battery 21. If the remanent stored energy as detected by the remanent stored energy detector 22 and sent as a signal to the warning controller 3 is lower than a predetermined level in a step 5, then the warning controller 3 applies a warning control signal to the optical indicator 32a to energize a lamp A thereof in a step 6.

At this time, the signal indicating the reduction in the remanent stored energy of the main battery 21 and the value of the remanent stored energy are stored in a non-volatile memory (not shown) of the warning controller 30. When turned on, the lamp A gives an optical warning indication to make the driver visually recognize that the remanent stored energy of the main battery 21 has dropped below the predetermined level. However, if the driver happens to overlook the optical warning of the lamp A and parks the vehicle without charging the main battery 21, the remanent stored energy of the main battery 21 may be reduced to such a level during parking that the electric-powered vehicle may not start again.

To avoid the above situation, the step 6 is followed by a step 7 which determines whether the main battery 21 is being charged or not. If the main battery 21 is not being charged in the step 7, then it is determined that the driver is going to leave the vehicle regardless of the danger that the remanent stored energy of the main battery 21 will be consumed, and the warning controller 30 produces a control signal to enable the sound output unit 31 to generate a warning sound in a step 8.

Figure 15:
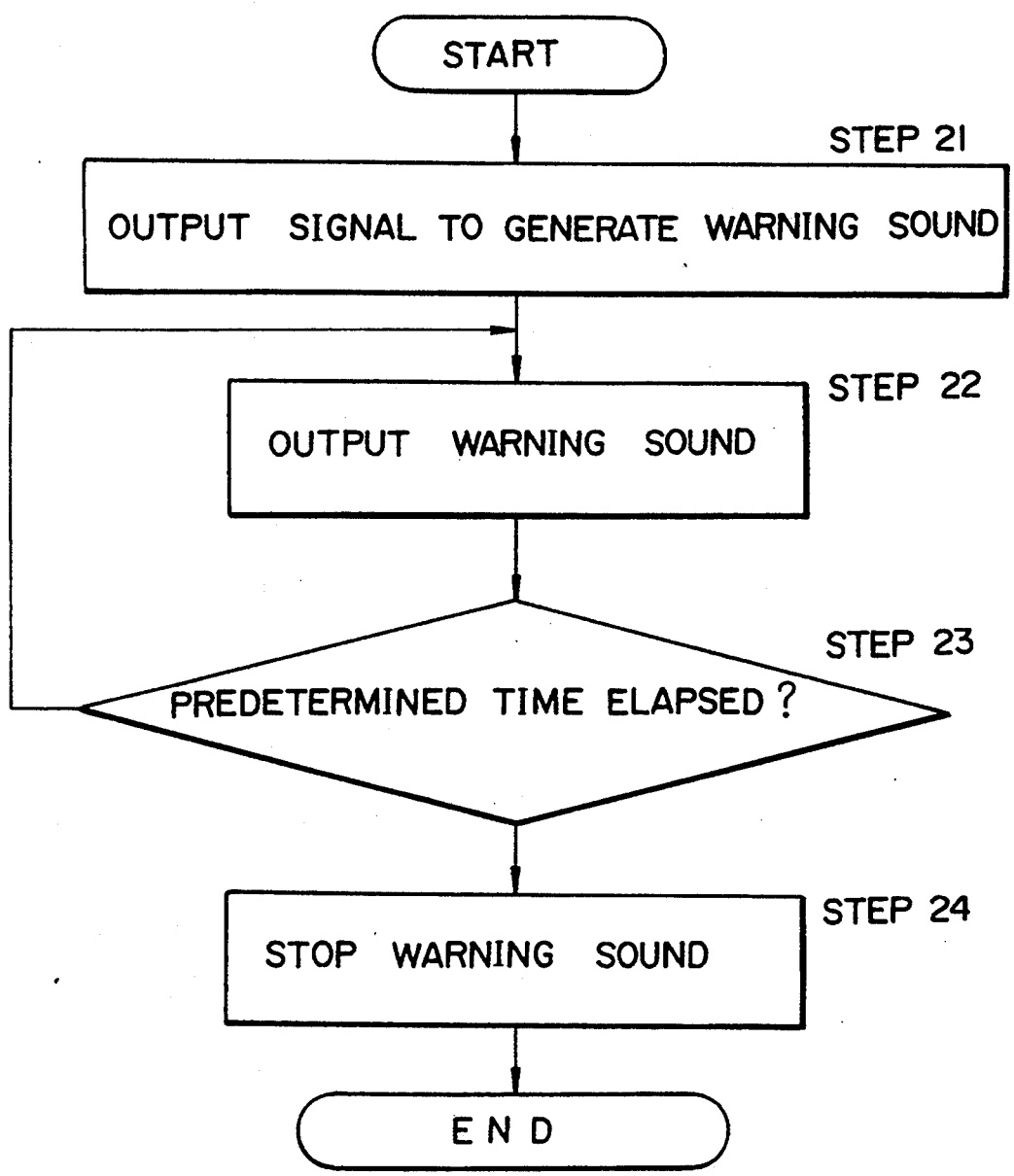
FIG. 15 is a flowchart of a subroutine of the operation sequence of the apparatus shown in FIG. 13 for generating and stopping a warning sound.

The warning sound is generated according to a subroutine shown in FIG. 15.

First, the warning controller 30 produces a control signal to generate a warning sound in a step 21. The control signal is transmitted from the warning controller 30 to the sound output unit 31, which converts the control signal into a warning sound and outputs the generated warning sound in a step 22. The control signal is also sent to the timer 33 that measures the period of time in which the warning sound is outputted.

If the period of time measured by the timer 33 reaches a predetermined period of time in a step 23, i.e., if the predetermined period of time elapses, then the timer 33 applies a signal to the warning controller 30. The sound output unit 31 keeps on producing the warning sound while the timer 33 is measuring the time.

In response to the signal from the timer 33, the warning controller 30 applies a disable signal to the sound output unit 31 to cause the latter to stop producing the warning sound in a step 24.

Since the warning sound is stopped upon elapse of the predetermined period of time, as described above, the consumption of the main battery 31 by the generation of the warning sound is minimized. Upon stoppage of the warning sound, the subroutine shown in FIG. 15 is ended, and control goes back to the main routine shown in FIG. 14.

The step 7 may be carried out by a comparator in the warning controller 30 which compares the remanent stored energy of the main battery 21 that is stored in the non-volatile memory with the remanent stored energy detected by the remanent stored energy detector 22, to determine whether the detected remanent stored energy is increasing or not.

If the main battery 21 is being charged in the step 7, then the warning controller 30 supplies a signal to the optical indicator 32b to energize a lamp B thereof indicating the charging of the main battery 21 in a step 9. At the same time, the warning controller 21 erases, from the non-volatile memory, the signal indicating the reduction in the remanent stored energy of the main battery 21.

After the step 8 or 9, the main routine shown in FIG. 14 comes to an end.

If the door 27 is not open in the step 3, then since the driver is in the vehicle and available for some necessary action, no warning sound is produced, and control is ended. If the remanent stored energy as detected by the remanent stored energy detector 22 is higher than the predetermined level in the step 5, no warning sound is produced either, and the main sequence is brought to an end.

If the door 27 is locked in the step 2, then the warning controller 30 checks the stored flag $F_{OPEN}$ to determine whether the door 27 has previously been opened or not in a step 10.

If $F_{OPEN}=1$, then since the door 27 has previously been opened and is then locked, and also since the driver is going to park the vehicle for a long period of time, the flag $F_{OPEN}$ is reset to 0 in a step 11. Thereafter, the steps 5, 6, 7, 8 or the steps 5, 6, 7, 9 are executed.

If $F_{OPEN}=0$ in the step 10, then control is ended because the door 27 has been locked continuously since the main switch 25 was turned off or the door 27 has once been opened and then locked with the warning sound being already produced.

If the main switch 25 is turned on in the step 1, then it indicates that the motor 23 is energized. The warning controller 30 determines whether the remanent stored energy as detected by the remanent stored energy detector 22 is higher than a predetermined level in a step 12. If the detected remanent stored energy is higher than the predetermined level in the step 12, the main routine is ended. If the detected remanent stored energy is lower than the predetermined level in the step 12, the warning controller 3 applies a warning control signal to the optical indicator 32a to energize the lamp A in a step 130 Thereafter, the main routine is ended.

As described above, when the remanent stored energy of the main battery 21 drops below the predetermined level while the electric-powered vehicle is running, the optical indicator 32a produces a warning according a flow in the steps 1, 12, 13. When the driver turns off the main switch 25 and opens the door 27, the sound output unit 31 generates a warning sound according to a flow in the steps 2 through 8.

When the driver locks the door 27, the step 2 detects the locking of the door 27 and the steps 10, 11 determine that the door 27 has once been opened and is then locked. Then, the sound output unit 31 generates a warning sound according to a flow in the steps 5 through 8.

The warning sound that is produced when the door 27 is locked after it has once been opened is louder than the warning sound that is produced when the door 27 is first open. This is because, when the door 27 is locked after it has once been opened, it is likely for the driver to be outside of the vehicle and going to leave the vehicle, and it is also highly possible for the driver to have failed to notice or forgotten the previous warning sound. The driver may alternatively have the wrong idea that he can get the electric-powered vehicle started again if any amount of electric energy remains stored in the storage battery, just like the fuel in the fuel tank of an engine-powered vehicle.

The louder warning sound is more effective to let the driver reliably recognize the possibility that the electric-powered vehicle he is about to park cannot start again if the remanent stored energy of the main battery 21 is reduced by a self-discharge while it is being parked.

The apparatus shown in FIG. 13 generates a warning sound continuously for a certain period of time when it produces a warning control signal. However, the apparatus may repeat the generation of a warning sound at suitable time intervals.

When the remanent stored energy of the main battery 21 drops below a predetermined level, the apparatus is capable of reliably detecting when the door 27 is first open after the main switch 25 has been turned off and also when the door 27 has once been opened and is then locked after the main switch 25 has been turned off, for giving a warning to the driver. The apparatus can thus minimize the consumption of the main battery 21.

As described above, when the driver is going to get out of and park the electric-powered vehicle, the generated warning sound lets the driver reliably recognize a reduction in the remanent stored energy of the main battery 21, and prompts the driver to have the main battery 21 charged. Since the remanent stored energy detector 22 shown in FIG. 13 is composed of the detecting apparatus shown in FIG. 1, the actual remanent stored energy of the main battery 21 can be detected, and the driver can recognize a need for charging the main battery 21 based on the detected actual remanent stored energy of the main battery 21.

The illustrated apparatus generates a warning sound regardless of whether the door 27 is open or closed, if the remanent stored energy of the main battery 21 is below a predetermined level when the door 27 has once been opened and is then locked. However, the apparatus may be arranged to generate a warning sound if the remanent stored energy of the main battery 21 is below a predetermined level when the door 27 is locked after it has been opened and closed.

While the optical indicators 32a, 32b comprise lamps A, B, respectively, in the illustrated embodiment as described above, they may comprise other optical light-emitting elements such as light-emitting diodes or the like.

The sound output unit 31 may produce an electronically produced beep or other alarm sound, or a synthesized or pre-recorded voice sound, as the warning sound.

Although certain preferred embodiments of the present invention have been shown and described in detail, it should be understood that various changes and modifications may be made therein without departing from the scope of the appended claims.

What is claimed is:

1. An apparatus for detecting the remanent stored energy in a storage battery, comprising:

current detecting means for detecting discharging and charging currents of the storage battery;

temperature detecting means for detecting a temperature of the storage battery;

counting means for detecting the number of times that the storage battery has been charged to capacity;

discharging current summing means for adding values of the discharged current of the storage battery as detected by said current detecting means at predetermined time intervals since the storage battery was fully charged, and for storing in memory the added values as a reference amount of consumed energy of the storage battery;

consumed energy calculating means for multiplying said reference amount of said consumed energy at a preset time by a first consumed-energy corrective coefficient which is determined depending on the temperature of the storage battery as detected by said temperature detecting means at the present time, thereby determining an amount of consumed electric energy of the storage battery;

subtracting means for subtracting the amount of consumed electric energy determined by said consumed energy calculating means from an initial amount of stored energy of the storage battery, thereby determining the difference as a reference remanent stored energy of the storage battery;

charging current adding means for adding values of the charging current of the storage battery as detected by said current detecting means at predetermined time intervals when the storage battery is charged, and for storing the added values as an amount of charged energy of the storage battery;

processing means for determining, as a first remanent-energy corrective coefficient, the ratio of said reference amount of consumed energy which has been stored by said discharging current adding means immediately before the storage battery was last charged and said amount of charged energy which has been stored by said charging current adding means when the last charging of the storage battery was completed; and remanent energy calculating means for determining a remanent stored energy of the storage battery by multiplying said reference remanent stored energy stored by said subtracting means, by said first remanent-energy corrective coefficient and a second remanent-energy corrective coefficient which is predetermined depending on the total number of times that the storage battery has been charged as detected by said counting means and the temperature of the storage battery as detected by said temperature detecting means when the storage battery was last charged.

2. An apparatus according to claim 1, further including connection detecting means for detecting whether a battery charger is connected to the storage battery or not, said counting means comprising means for detecting the number of times that the storage battery has been charged as the number of times that said battery charger has been connected to the storage battery as detected by said connection detecting means.

3. An apparatus according to claim 1, further including voltage detecting means for detecting a voltage across the storage battery, said discharging current adding means comprising means for starting to add values of the discharging current when the voltage detected by said voltage detecting means is equal to or higher than a predetermined voltage corresponding to a fully charged condition of the storage battery while the storage battery is being charged.

4. An apparatus according to claim 1, wherein said discharging current adding means comprises means for adding values of the discharging current when the discharging current as detected by said current detecting means is equal to or higher than a predetermined current.

5. An apparatus according to claim 1, wherein said consumed-energy coefficient is of a value which is larger as the temperature of the storage battery goes higher.

6. An apparatus according to claim 5, wherein said consumed energy calculating means comprising means for multiplying said reference amount of consumed energy by said first consumed-energy corrective coefficient and a second consumed-energy corrective coefficient which varies depending on the discharging current of the storage battery as detected by said current detecting means at the present time, thus determining said amount of consumed electric energy.

7. An apparatus according to claim 6, wherein said second consumed-energy coefficient is of a value which is larger as the discharging current of the storage battery becomes larger.

8. An apparatus according to claim 1, wherein said initial amount of stored energy of the storage battery is equal to a rated storage capacity of the storage battery.

9. An apparatus according to claim 1, wherein said initial amount of stored energy of the storage battery is of a value which is reduced stepwise depending on a period of time that elapses since the storage battery was first used.

10. An apparatus according to claim 1, further including connection detecting means for detecting whether a battery charger is connected to the storage battery or not, and voltage detecting means for detecting a voltage across the storage battery, said charging current adding means comprising means for adding values of the charging current as detected by said current detecting means after the battery charger is connected to the storage battery as detected by said connection detecting means until the voltage as detected by said voltage detecting means reaches a predetermined voltage corresponding to a fully charged condition of the storage battery.

11. An apparatus according to claim 1, wherein said second remanent-energy corrective coefficient is determined depending on the total number of times that the storage battery has been charged and the temperature of the storage battery as detected by said temperature detecting means when the storage battery starts being charged.

12. An apparatus according to claim 11, wherein said second remanent-energy corrective coefficient is of a value which is smaller as the number of times that the storage battery has been charged is larger, larger as the temperature of the storage battery goes higher below a predetermined temperature, and smaller as the temperature of the storage battery goes higher beyond said predetermined temperature.

13. An apparatus according to claim 1, wherein said consumed energy calculating means comprises means for multiplying said reference amount of consumed energy by said first consumed-energy corrective coefficient and a third consumed-energy corrective coefficient which is predetermined depending on the discharging current as detected by said current detecting means at the present time and a period of time during which the detected discharging current is continuously maintained at a constant level up to the present time, thereby determining said amount of consumed electric energy.

14. An apparatus according to claim 13, wherein said discharging current adding means includes memory means for storing a plurality of detected values of the discharging current in a time series at predetermined time intervals retrospectively up to the present time, said consumed energy calculating means comprising means for comparing the values of the discharging current which are stored in said memory means, successively retrospectively from the present time, with the detected value of the discharging current at the present time, determining the period of time during which the detected value of the discharging current at the present time is continuously maintained at the constant level up to the present time, and determining said second consumed-energy corrective coefficient depending on the determined period of time and the discharging current as detected by said current detecting means at the present time.

15. An apparatus according to claim 14, wherein said third consumed-energy corrective coefficient is of a value which is larger as the discharging current of the storage battery is larger and which is larger as the determined period of time is longer.

16. An apparatus according to claim 13, further including voltage detecting means for detecting a voltage across the storage battery, and specific gravity detecting means for detecting a specific gravity of the storage battery, said consumed energy calculating means comprising means for multiplying said reference amount of consumed energy which is stored by said discharging current adding means at the present time, by said first consumed-energy corrective coefficient, said third consumed-energy corrective coefficient, a fourth consumed-energy corrective coefficient which is predetermined depending on the voltage as detected by said voltage detecting means at the present time, and a fifth consumed-energy corrective coefficient which is predetermined depending on the specific gravity of the storage battery as detected by said specific gravity detecting means at the present time, thereby determining said amount of consumed electric energy.

17. An apparatus according to claim 16, wherein said fourth consumed-energy corrective coefficient is of a value which is larger as the voltage across the storage battery is lower.

18. An apparatus according to claim 16, wherein said fifth consumed-energy corrective coefficient is of a value which is larger as the specific gravity of the storage battery is lower.

19. An apparatus according to claim 1, further including warning means for generating a warning when said remanent stored energy as calculated by said remanent energy calculating means is smaller than a predetermined level.

20. An apparatus according to claim 1, wherein said discharging current adding means comprises means for adding values of the discharging current as detected by said current detecting means is equal to or higher than a predetermined current, said predetermined current corresponding to the current required to operate the apparatus.

21. An apparatus according to claim 1, wherein said discharging current adding means comprises means for adding values of the discharging current as detected by said current detecting means is equal to or higher than a predetermined current, said predetermined current corresponding to the current required to operate accessory loads not substantially affecting the remanent stored energy of the storage battery.

22. An apparatus for warning of a reduction in the remanent stored energy of a storage battery installed as a power source on an electric-powered vehicle, comprising:
  remanent energy detecting means for detecting the remanent stored energy of the storage battery;
  switch opening/closing detecting means for detecting whether a main switch of the electric-powered vehicle is turned on or off;
  door opening/closing detecting means for detecting whether a door of the electric-powered vehicle is open or closed; and
  warning controlling means for producing a warning sound if said remanent stored energy of the storage battery as detected by said remanent energy detecting means is smaller than a predetermined level when said main switch is turned off as detected by said switch opening/closing means, and said door is open as detected by said door opening/closing means.

23. An apparatus according to claim 22, wherein said warning controlling means comprises means for producing a warning sound for a predetermined period of time.

24. An apparatus according to claim 22, wherein door locking detecting means for detecting whether said door is locked are provided and said warning controlling means comprises means for producing a warning sound also if said remanent stored energy of the storage battery as detected by said remanent energy detecting means is smaller than a predetermined level when said main switch is turned off as detected by said switch opening/closing means, said door is open as detected by said door opening/closing means, and said door is locked as detected by said door locking detecting means after said door has been opened.

25. An apparatus according to claim 24, wherein said warning sound produced by said warning controlling means if said remanent stored energy of the storage battery as detected by said remanent energy detecting means is smaller than said predetermined level when said main switch is turned off as detected by said switch opening/closing means, said door is open as detected by said door opening/closing means, said door is locked as detected by said door locking detecting means after said door has been opened, is louder than said warning sound produced by said warning controlling means if said remanent stored energy of the storage battery as detected by said remanent energy detecting means is smaller than a predetermined level when said main switch is turned off as detected by said switch opening/closing means, and said door is open as detected by said door opening/closing means.

26. An apparatus according to claim 22, wherein said warning controlling means includes means for generating an optical warning if said remanent stored energy of the storage battery as detected by said remanent energy detecting means is smaller than a predetermined level.

27. An apparatus according to claim 22, wherein said warning controlling means comprises means for stopping said warning sound when the storage battery is being charged while said main switch is being turned off.

28. An apparatus for detecting the remanent stored energy in a storage battery, comprising:
  temperature detecting means for detecting a temperature of the storage battery;
  means for determining a reference amount of consumed energy of the storage battery; and
  consumed energy calculating means for multiplying said reference amount of consumed energy at a present time by a first consumed-energy corrective coefficient which is determined depending on the temperature of the storage battery as detected by said temperature detecting means at the present time, thereby determining an amount of consumed electric energy of the storage battery; and
  subtracting means for subtracting the amount of consumed electric energy determined by said consumed energy calculating means from an initial amount of stored energy of the storage battery, thereby determining the difference as reference remanent stored energy of the storage battery; and
  remanent energy calculating means for determining a remanent stored energy of the storage battery by multiplying said reference remanent stored energy calculated by said subtracting means by a remanent-energy corrective coefficient which is predetermined depending on the temperature of the storage battery as detected by said temperature detecting means when the storage battery was last charged.

29. An apparatus according to claim 28, further including current detecting means for detecting discharging and changing currents of the storage battery and wherein said means for determining a reference amount of consumed energy of the storage battery includes discharging current adding means for adding values of the discharging current of the storage battery as detected by said current detecting means at predetermined time intervals since the storage battery was fully charged and the storing the added values as said reference amount of consumed energy of the storage battery.

30. An apparatus according to claim 29, further including charging current adding means for adding values of the charging current of the storage battery as detected by said current detecting means at predetermined time intervals when the storage battery is charged, and for storing the added values as an amount of charged energy of the storage battery.

31. An apparatus according to claim 30, further including means for determining a reference remanent stored energy; processing means for determining, as a remanent-energy corrective coefficient, the ratio of said reference amount of consumed energy which has been stored by said discharging current adding means immediately before the storage battery was last charged and said amount of charged energy which has been stored by said charging current adding means when the last charging of the storage battery was completed; and remanent energy calculating means for determining a remanent stored energy of the storage battery by multiplying said reference remanent stored energy by said remanent-energy corrective coefficient.

32. An apparatus according to claims 30, further including connection detecting means for detecting whether a battery charger is connected to the storage battery or not, and voltage detecting means for detecting a voltage across the storage battery, said charging current adding means comprising means for adding values of the charging current as detected by said current detecting means after the battery charger is connected to the storage battery as detected by said connection detecting means until the voltage as detected by said voltage detecting means reaches a predetermined voltage corresponding to a fully charged condition of the storage battery.

33. An apparatus according to claim 29, wherein said discharging current adding means comprises means for adding values of the discharging current when the discharging current as detected by said current detecting means is equal to or higher than a predetermined current.

34. An apparatus according to claim 28, further including counting means for detecting the number of times that the storage battery has been charged; means for determining a reference remanent stored energy of the storage battery; and remanent energy calculating means for determining a remanent stored energy of the storage battery by multiplying said reference remanent stored energy by a remanent-energy corrective coefficient which is predetermined depending on the total number of times that the storage battery has been charged as detected by said counting means and the temperature of the storage battery as detected by said temperature detecting means when the storage battery was last charged.

35. An apparatus according to claim 34, further including connection detecting means for detecting whether a battery charger is connected to the storage battery or not, said counting means comprising means for detecting the number of times that the storage battery has been charged as the number of times that said battery charger has been connected to the storage battery as detected by said connection detecting means.

36. An apparatus according to claim 28, further including voltage detecting means for detecting a voltage across the storage battery, said means for determining a reference amount of consumed energy including means for starting to add values of the discharging current when the voltage detected by said voltage detecting means is equal to or higher than a predetermined voltage corresponding to a fully charged condition of the storage battery while the storage battery is being charged.

37. An apparatus for detecting the remanent stored energy in a storage battery installed as a power source on an electric powered vehicle comprising:

current detecting means for detecting discharging and charging currents of the storage battery;

temperature detecting means for detecting a temperature of the storage battery;

counting means for detecting the number of times that the storage battery has been charged to capacity;

discharging current summing means for adding values of the discharged current of the storage battery as detected by said current detecting means at predetermined time intervals since the storage battery was fully charged, and for storing in memory the added values as a reference amount of consumed energy of the storage battery;

consumed energy calculating means for multiplying said reference amount of said consumed energy at a preset time by a first consumed-energy corrective coefficient which is determined depending on the temperature of the storage battery as detected by said temperature detecting means at the preset time, thereby determining an amount of consumed electric energy of the storage battery;

subtracting means for subtracting the amount of consumed electric energy determined by said consumed energy calculating means from an initial amount of stored energy of the storage battery, thereby determining the difference as a reference remanent stored energy of the storage battery;

charging current adding means for adding values of the charging current of the storage battery as detected by said current detecting means at predetermined time intervals when the storage battery is charged, and for storing in memory the added values as an amount of charged energy of the storage battery;

processing means for determining, as a first remanent-energy corrective coefficient, the ratio of said reference amount of consumed energy which has been stored by said discharging current adding means immediately before the storage battery was last charged and said amount of charged energy which has been stored by said charging current adding means when the last charging of the storage battery was completed; and remanent energy calculating means for determining a remanent stored energy of the storage battery by multiplying said reference remanent stored energy stored by said subtracting means, by said first remanent-energy corrective coefficient which is predetermined depending on the total number of times that the storage battery has been charged as detected by said counting means and the temperature of the storage battery as detected by said temperature detecting means when the storage battery was last charged; and switch opening/closing detecting means for detecting whether a main switch of the electric-powered vehicle is turned on or off; and door opening/closing detecting means for detecting whether a door of the electric-powered vehicle is open or closed;

door locking detecting means for detecting whether said door is locked or not; and warning controlling means for producing a warning sound if said remanent stored energy of the storage battery as calculated by said remanent energy calculating means is smaller than a predetermined level when said main switch is turned off as detected by said switch opening/closing means, said door is open as detected by said door opening/closing means, and said door is locked as detected by said door locking detecting means after said door has been opened.

38. An apparatus for detecting the remanent stored energy in a storage battery, comprising:

temperature detecting means for detecting a temperature of the storage battery;

means for determining a reference amount of consumed energy of the storage battery; and consumed energy calculating means for multiplying said reference amount of consumed energy at a present time by a first consumed-energy corrective coefficient which is determined depending on the temperature of the storage battery as detected by said temperature detecting means at the present time, thereby determining an amount of consumed electric energy of the storage battery; and remanent energy calculating means for determining a remanent stored energy of the storage battery by multiplying a reference remanent stored energy by a remanent-energy corrective coefficient which is predetermined depending on the temperature of the storage battery as detecting by said temperature detecting means when the storage battery was last charged.

* * * * *